(12) United States Patent
Miller, Jr.

(10) Patent No.: US 7,376,874 B2
(45) Date of Patent: May 20, 2008

(54) METHOD OF CONTROLLING A TEST MODE OF A CIRCUIT

(75) Inventor: James E. Miller, Jr., Boise, ID (US)

(73) Assignee: Micron Technology, Inc., Boise, ID (US)

( * ) Notice: Subject to any disclaimer, the term of this patent is extended or adjusted under 35 U.S.C. 154(b) by 687 days.

(21) Appl. No.: 10/804,371

(22) Filed: Mar. 19, 2004

(65) Prior Publication Data
US 2004/0181725 A1  Sep. 16, 2004

Related U.S. Application Data

(60) Continuation of application No. 10/449,452, filed on May 30, 2003, now Pat. No. 6,760,875, which is a continuation of application No. 10/155,398, filed on May 22, 2002, now Pat. No. 6,591,386, which is a continuation of application No. 09/658,327, filed on Sep. 8, 2000, now Pat. No. 6,421,800, which is a continuation of application No. 09/324,738, filed on Jun. 3, 1999, now Pat. No. 6,138,258, which is a division of application No. 08/883,181, filed on Jun. 26, 1997, now Pat. No. 5,944,845.

(51) Int. Cl.
*G01R 31/28* (2006.01)

(52) U.S. Cl. .................................................. 714/724
(58) Field of Classification Search .................. None
See application file for complete search history.

(56) References Cited

U.S. PATENT DOCUMENTS

| | | | |
|---|---|---|---|
| 4,366,393 A | 12/1982 | Kasuya | 307/221 R |
| 4,398,146 A | 8/1983 | Draheim et al. | 324/73 R |
| 5,155,704 A | 10/1992 | Walther et al. | 365/201 |
| 5,168,181 A | 12/1992 | Baiocchi et al. | 307/520 |
| 5,245,577 A | 9/1993 | Duesman et al. | 365/201 |
| 5,408,435 A | 4/1995 | McClure et al. | 365/201 |
| 5,475,640 A | 12/1995 | Kersh, III et al. | 365/200 |
| 5,604,756 A | 2/1997 | Kawata | 371/67.1 |
| 5,615,164 A | 3/1997 | Kirihata et al. | 365/230.06 |
| 5,651,123 A | 7/1997 | Nakagawa et al. | 395/384 |
| 5,734,661 A * | 3/1998 | Roberts et al. | 714/733 |
| 5,778,004 A | 7/1998 | Jennion et al. | 371/22.1 |
| 5,787,096 A | 7/1998 | Roberts et al. | 371/21.1 |
| 5,831,997 A | 11/1998 | Kodashiro | 371/27.1 |
| 5,935,266 A * | 8/1999 | Thurnhofer et al. | 714/726 |
| 5,944,845 A | 8/1999 | Miller | 714/724 |
| 5,951,703 A | 9/1999 | Sprouse et al. | 714/730 |
| 6,061,817 A | 5/2000 | Jones et al. | 714/738 |
| 6,138,258 A | 10/2000 | Miller | 714/724 |
| 6,421,800 B1 | 7/2002 | Miller | 714/724 |
| 6,591,386 B2 | 7/2003 | Miller | 714/724 |

\* cited by examiner

*Primary Examiner*—Christine T. Tu
(74) *Attorney, Agent, or Firm*—TraskBritt

(57) ABSTRACT

A test vector decode circuit includes a lockout circuit to prevent inadvertent latching of output vectors. The test vector decode circuit is driven by an additional output vector from the test vector decode circuit. The additional output vector, as well as the other output vectors, undergo at least one latching. The signal transmitted by the additional output vector as a result of the final latching activates the lockout circuit. The test vector decode circuit also receives a supervoltage signal. Only by turning off the supervoltage signal can all of the output test vectors be reset, including the additional output vector.

13 Claims, 3 Drawing Sheets

METHOD OF CONTROLLING A TEST MODE OF A CIRCUIT

CROSS-REFERENCE TO RELATED APPLICATIONS

This application is a continuation of U.S. patent application Ser. No. 10/449,452 filed May 30, 2003, now U.S. Pat. No. 6,760,875; issued Jul. 6, 2004; which is a continuation of U.S. patent application Ser. No. 10/155,398 filed May 22, 2002 and issued as U.S. Pat. No. 6,591,386 on Jul. 8, 2003; which is a continuation of U.S. patent application Ser. No. 09/658,327 filed Sep. 8, 2000 and issued as U.S. Pat. No. 6,421,800 on Jul. 16, 2002; which is a continuation of U.S. patent application Ser. No. 09/324,738, filed Jun. 3, 1999 and issued as U.S. Pat. No. 6,138,258 on Oct. 24, 2000; which is a divisional of U.S. patent application Ser. No. 08/883,181, filed Jun. 26, 1997 and issued as U.S. Pat. No. 5,944,845 on Aug. 31, 1999.

TECHNICAL FIELD

This invention relates generally to integrated circuit devices and, more specifically, to a circuit and method for controlling the ability of such devices to enter into a test mode.

BACKGROUND

The testing of memory devices in the prior art generally involves receiving inputs from several memory addresses at one time into a test vector decoding circuit and performing logic functions on those inputs. The resulting output test vectors are used to perform operations on various devices, such as compressing address circuits or disabling regulators. Once testing has been completed, the values of the output test vectors will remain consistent for the purpose of driving circuits during non-test operations of the memory device.

One possible method of triggering the test mode as disclosed in the prior art is to use two signals. For example, a WCBR signal (Write enable signal at low with the CAS signal transmitted Before the RAS signal) sent during the transmission of a supervoltage signal is often used. The supervoltage signal will have a higher potential than the standard supply voltage. This supervoltage signal may generally be applied consistently throughout both test and non-test modes of the memory device. Only during the test mode, however, will the WCBR signal deliberately appear.

Nevertheless, it is possible that placing the memory device in a noisy environment may result in an errant WCBR signal being sent to the test vector decode circuit during a non-test mode. For example, memory devices are often subjected to a burn-in process, wherein the memory devices are operated at higher-than-usual voltages and temperatures in order to identify weak memory devices. This noisy process could result in random signals being transmitted through the write enable, CAS, and RAS paths so as to trigger a false WCBR signal and latch the test vector decode circuit. In that event, the test vector decode circuit would process the memory address inputs at their present random state. The resulting output vectors might not have the proper values. As a consequence, parts of the integrated device that should receive a particular value may no longer do so. For example, it is possible that one of the output vectors may represent an errant "ground $V_{BB}$" signal transmitted at the wrong time. That would ground the substrate of the memory device, thereby causing a high current mode and eventual meltdown of the circuitry. Therefore, it would be a benefit to the art to be able to prevent the memory circuit from inadvertently entering a test mode.

SUMMARY OF THE INVENTION

Accordingly, one embodiment of the present invention provides a lockout circuit for an operations circuit. The operations circuit is configured to receive one or more sets of inputs. Upon receiving a latching signal, the operations circuit performs a decode operation on the present set of inputs $A_0$ through $A_n$. The decode operation, in turn, establishes a value for one or more output vectors in response to a latch signal. Further, a disable vector is included as one of the output vectors. At least one of the input sets is configured to establish a lockout value for the disable vector. Thus, once the appropriate set is input and latched, the resulting disable vector prevents inadvertent latching signals from reaching the operations circuit. However, the operations circuit is also configured to receive a reset signal and reset the disable vector in response to that signal.

In another embodiment, the operations circuit is a test vector decode circuit configured to receive a supervoltage signal. The supervoltage signal is generally maintained during all operations of the test vector decode circuit. The test vector decode circuit is configured to reset all output vectors in response to turning off the supervoltage signal. In addition, the latching signal is combined with the disable vector through logic circuitry before reaching the test vector decode circuit. Latching operations proceed as described above until the disable vector changes the logic circuitry output, thereby locking out further latching signals. Once that occurs, the output vectors will not change unless the supervoltage signal is removed. In that event, all of the test vectors would be reset and any errors in the operation of the memory circuit could more likely be traced to the interruption of the supervoltage signal rather than to inadvertent latching signals. Thus, in addition to the advantages of preventing inadvertent activation of the test mode using a minimal amount of die space, this embodiment also simplifies error detection and correction.

Still other exemplary embodiments operate similarly but use different logic circuitry configurations. Further, the test vector decode circuits in these embodiments are configured to enable latching and resetting in a manner consistent with the logic circuitry configurations.

DETAILED DESCRIPTION OF THE INVENTION

Figure 1:
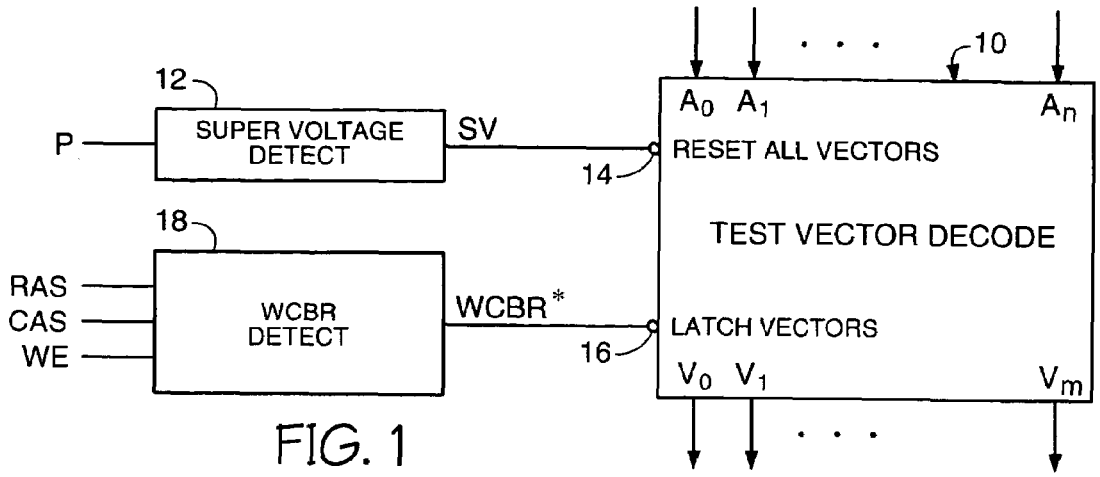
FIG. 1 depicts a schematic diagram of a test mode circuit as exists in the prior art.

As FIG. 1 demonstrates, testing the operation of a memory circuit as taught by the prior art is generally performed by directing signals to a test vector decode circuit 10 from a plurality of memory addresses $A_0$ through $A_n$, wherein n is an integer. The test vector decode circuit 10 is usually a multiplexer, but regardless of the specific configuration of the test vector decode circuit 10, it will subject the inputs to one or more logic operations and generate a plurality of output test vectors $V_0$ through $V_m$, wherein m is an integer that may or may not be equal to integer n. In addition, a supervoltage detect circuit 12 is provided and is configured to respond to an external signal P by transmitting a supervoltage signal (SV) to a reset input terminal 14 of the test vector decode circuit 10.

Figure 2:
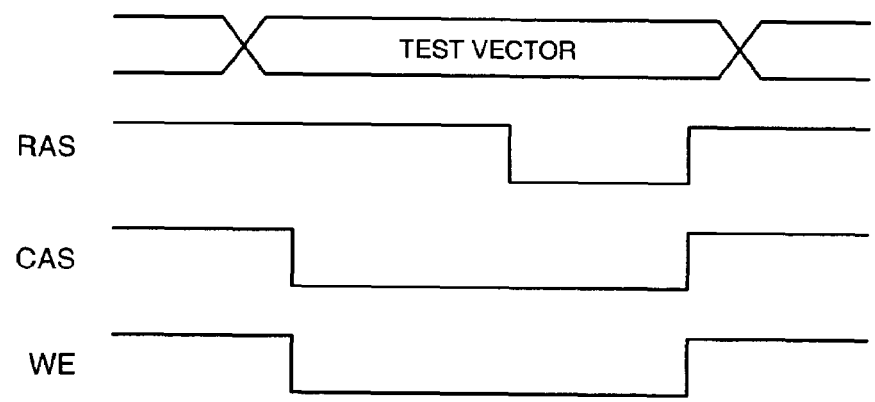
FIG. 2 is a timing diagram illustrating the combined input signals used, both in the prior art and in an exemplary embodiment of the claimed invention, to latch the test vectors to output.

The test vector decode circuit 10 resets all output test vectors $V_0$ through $V_m$ in response to a low SV signal. Thus, as long as SV remains at a high supervoltage potential, the output test vectors $V_0$ through $V_m$ maintain the values established as of the last logic operation. Logic operations are initiated by a signal sent to a latch input terminal 16 of the test vector decode circuit 10. In this embodiment, the test vector decode circuit 10 is configured to allow latching of the output test vectors $V_0$ through $V_m$ in response to a low WCBR signal, designated in FIG. 1 as WCBR*. This WCBR* signal is output by a WCBR detect circuit 18 which receives the signals RAS (Row Address Strobe), CAS (Column Address Strobe), and WE (Write Enable). FIG. 2 demonstrates the required state of these signals in order to latch the output test vectors: if (1) WE is low, and (2) CAS transmits a low signal before RAS does, then the WCBR circuit will output a WCBR* signal for latching the output test vectors $V_0$ through $V_m$. FIG. 2 also illustrates the cycle length of the test vectors in relation to the duration of the three signals. After the output test vectors $V_0$ through $V_m$ have been latched, they are used to drive external devices. Further inputs and latchings may be used to alter the drive of these external devices. Once testing is over, however, the drive signals should generally maintain their value.

The combination of signals generating WCBR is chosen to trigger the latching of the output vectors because that combination is not intentionally used during non-test operations of the memory device. This reduces the chance of accidental latching and changing of the output test vectors at inappropriate times. As mentioned above, however, that combination of signals may appear as a glitch in noisy environments such as the burn-in process.

Figure 3:
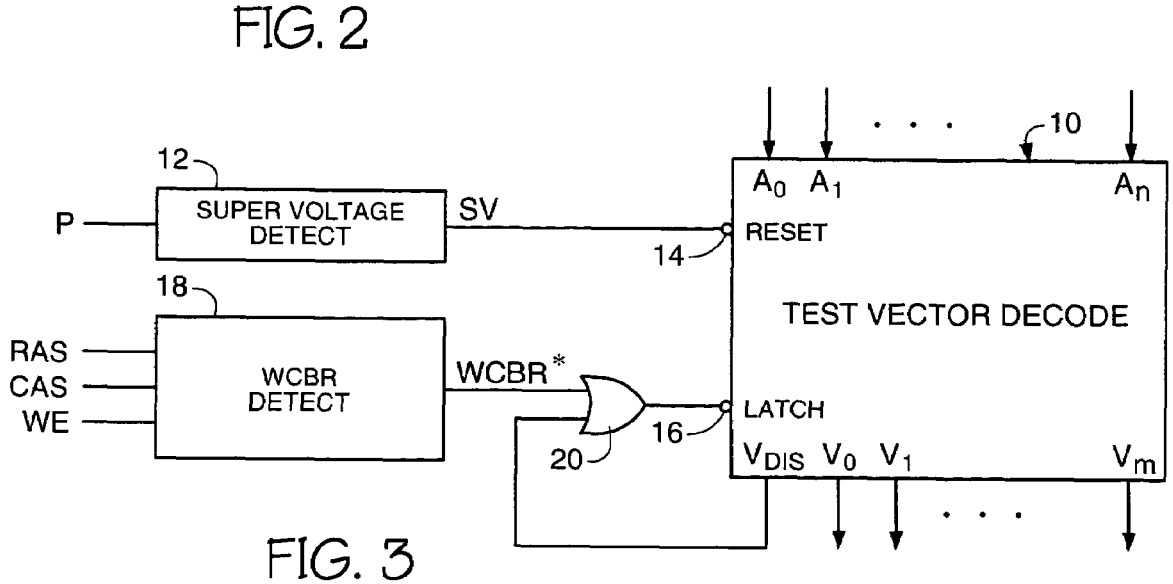
FIG. 3 is a schematic diagram of one exemplary embodiment of the present invention.

In order to prevent such accidental latching and the resulting consequences, a preferred embodiment of the present invention provides an additional output test vector $V_{dis}$ that is used in conjunction with a logic unit such as an OR gate 20 to lock out further WCBR* signals. As shown in FIG. 3, the OR gate 20 is electrically interposed between the WCBR detect circuit 18 and the latch input terminal 16. As a result, the WCBR* signal serves as a first input for the OR gate 20. The output test vector $V_{dis}$ serves as a second input for the OR gate 20. Initially, $V_{dis}$ transmits a low signal and WCBR* transmits a high signal. As a result, the OR gate 20 outputs a high signal and there is no latching.

When CAS is transmitted before RAS with WE at low, the WCBR* signal changes to low. The OR gate 20 recognizes the change. Accordingly, the output of OR gate 20 also changes to low and allows electrical communication within the test vector decode circuit 10. As a result of the decode operations performed on the inputs, the values of one or more output vectors are established. If $V_{dis}$ is one of the output vectors affected by the inputs, then $V_{dis}$ will generate and maintain a high signal. This signal, which can be described as a "lockout" signal for purposes of this application, changes the OR gate 20 output back to a high signal. Regardless of further changes in the WCBR* signal, the OR gate 20 will continue to output a high signal as long as $V_{dis}$ is high. Thus, the high signal from $V_{dis}$ blocks any other output test vector from being latched, and the test mode is ended. The only way this test vector lockout mode can be changed is if a low SV signal is transmitted to the reset input terminal 14. Doing so activates the reset function of the test vector decode circuit 10. Therefore, if the tested devices are operating in an unexpected manner, it is more likely that such a problem would be due to the supervoltage signal and its related circuitry rather than to accidental latching of the output test vectors.

Figure 4:
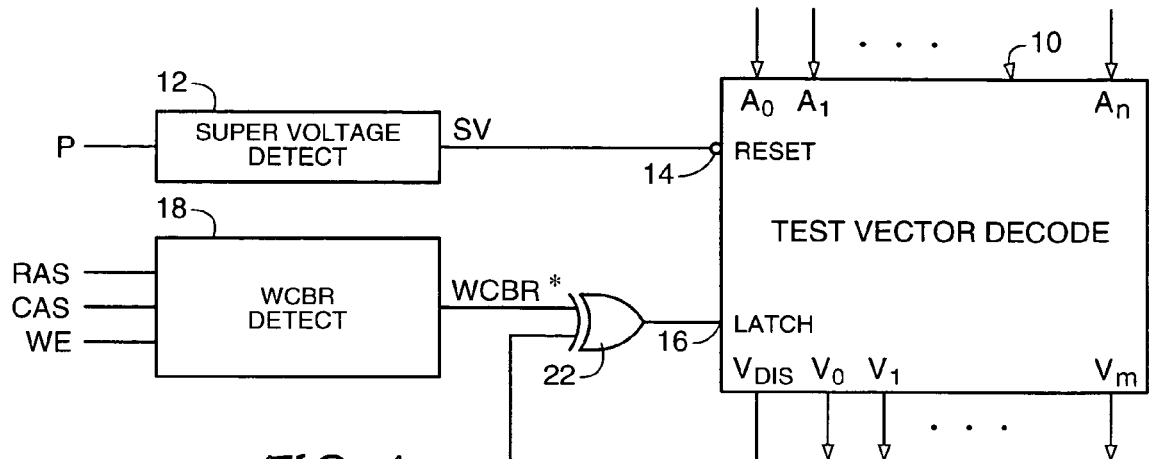
FIG. 4 is a schematic diagram of a second exemplary embodiment of the present invention.

Moreover, the current invention covers other embodiments having different lockout configurations. For example, FIG. 4 illustrates that the OR gate can be replaced by another logic unit, such as a NOR gate 22. While the required input values remain the same as in the previous embodiment, the test vector decode circuit 10 is now configured to allow latching in response to a high signal received at the latch input terminal 16. Thus, before lockout, $V_{dis}$ transmits a low signal. Accordingly, the NOR gate 22 will transmit a high latch enable signal in response to the low WCBR* input. Once the appropriate inputs are decoded to change the value of $V_{dis}$ to a high signal, the NOR gate 22 will continue to transmit a low signal, regardless of further low WCBR* signals, until the output vectors are reset.

Figure 5:
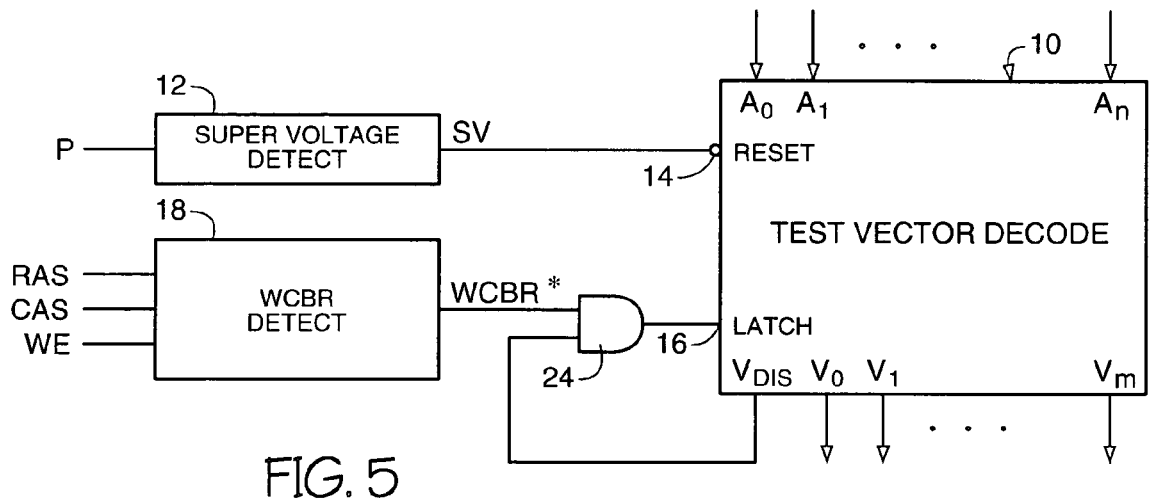
FIG. 5 is a schematic diagram of a third exemplary embodiment of the present invention.

In addition to using other logic units, one could choose to enable a lockout mode in response to different inputs. In FIG. 5, the test vector decode circuit 10 is once again configured to enable latching in response to a high signal. In this embodiment, however, the enabling signal comes from the output of an AND gate 24. Furthermore, $V_{dis}$ is initially transmitting a high signal rather than a low one. Thus, latching will occur during this $V_{dis}$ state when WCBR* is high rather than low. In order to lock out further WCBR* signals, the $V_{dis}$ vector must be changed to low by decoding the proper input values.

Figure 6:
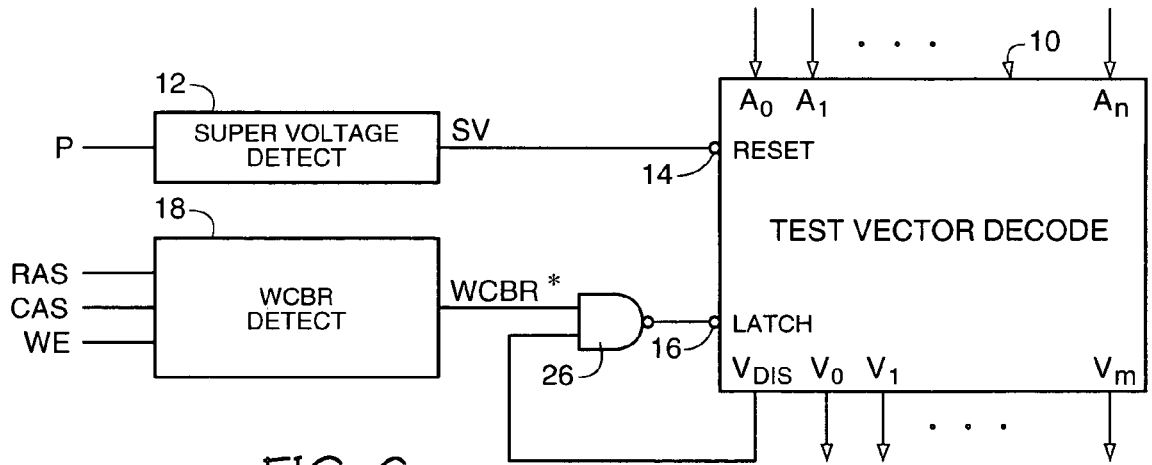
FIG. 6 is a schematic diagram of a fourth exemplary embodiment of the present invention.

FIG. 6 depicts yet another embodiment, wherein the test vector decode circuit 10 is configured to allow latching in response to a low signal output from a NAND gate 26. As in the previous embodiment, a high WCBR* signal will cause latching only as long as $V_{dis}$ transmits a high signal.

Figure 7:
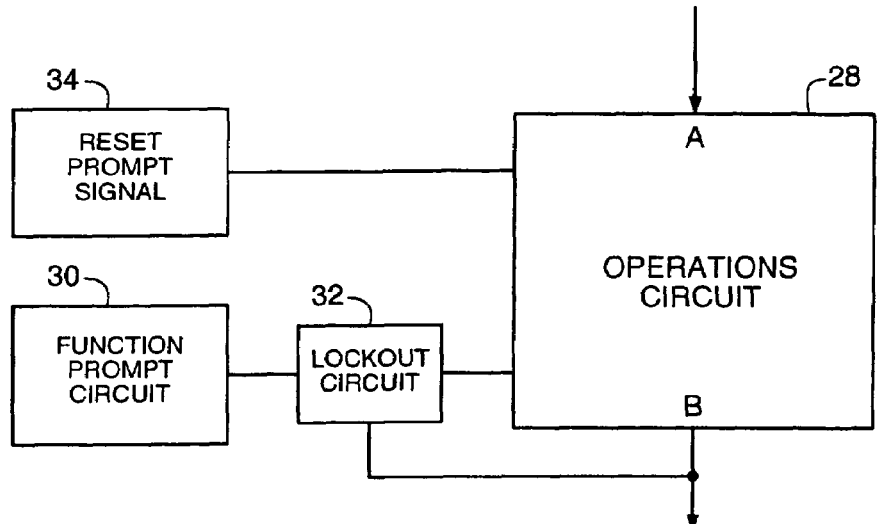
FIG. 7 is a schematic diagram of a fifth exemplary embodiment of the present invention.

It should be further noted that WCBR* and SV are not the only signals that could be used to latch and reset the output vectors. They have been identified in this specification for demonstrative purposes only. FIG. 7 illustrates that, in general, all that is needed is some sort of operations circuit 28 configured to receive at least one input A, perform some function based on that input, and transmit at least one output B. In addition, the operations circuit 28 is configured to perform its function in response to receiving a function prompt signal 30. However, that signal 30 is subject to being blocked by any embodiment of the current invention, such as some form of lockout circuit 32. Nevertheless, the operations circuit 28 could be configured to once again receive the latching prompt signal in response to a reset prompt signal 34.

Figure 8:
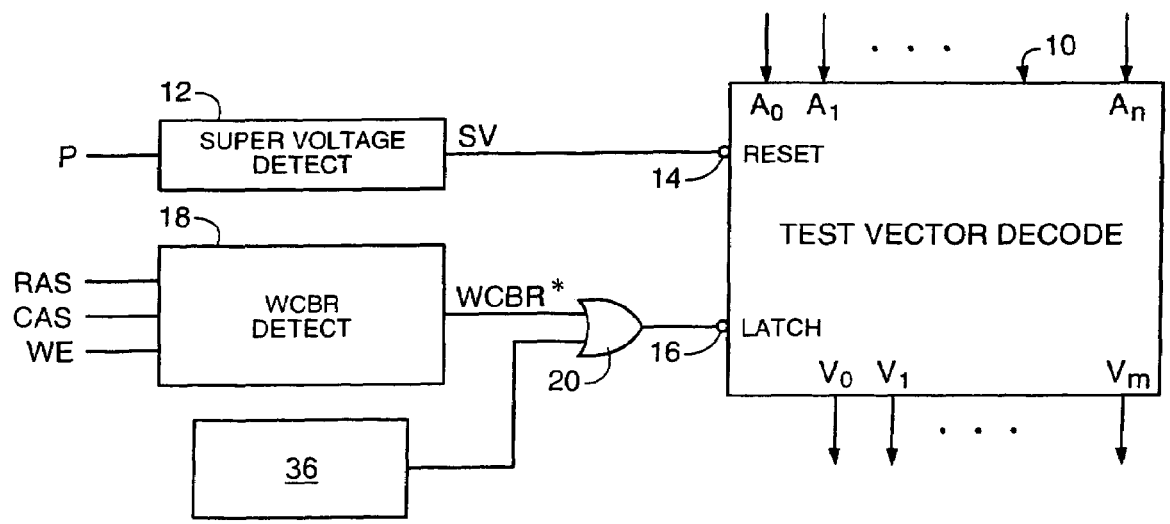
FIG. 8 is a schematic diagram of a sixth exemplary embodiment of the present invention.

One of ordinary skill can appreciate that, although specific embodiments of this invention have been described for purposes of illustration, various modifications can be made without departing from the spirit and scope of the invention. For example, the memory device could be configured to provide a test vector lockout signal from an external device 36 that is independent from the test vector decode circuit 10 and the output test vectors $V_0$ through $V_m$, as shown in FIG. 8. Furthermore, resetting the test vector lockout signal could also be independent from resetting all other output vectors. Such an embodiment could comprise sending a reset signal directly to the external device 36. Accordingly, the invention is not limited except as stated in the claims.

What is claimed is:

1. A method of preventing a circuit having a test mode entry function from entering a subsequent test mode after the circuit enters a first test mode, comprising:

initiating a test mode blocking signal after the circuit completes the first test mode; and exclusively controlling the test mode entry function of the circuit with the test mode blocking signal.

2. The method of claim 1, further comprising generating the test mode blocking signal responsive to a final test latch of the circuit during the first test mode.

3. The method of claim 2, further comprising originating the test mode blocking signal from the circuit.

4. The method of claim 1, further comprising resetting the test mode blocking signal in response to a reception of a reset prompt signal.

5. The method of claim 1, wherein the initiating a test mode blocking signal is in response to receipt of a test-node-end signal.

6. The method of claim 1, wherein exclusively controlling with the test mode blocking signal includes gating the test mode entry function with one of an OR, NOR, AND, or NAND logic gate.

7. The method of claim 1, further comprising preserving a state of an output of the circuit responsive to the test mode entry function in response to activation of the test mode blocking signal.

8. The method of claim 1, wherein the test mode blocking signal is an output of the circuit responsive to the test mode entry function.

9. The method of claim 1, wherein initiating a test mode blocking signal comprises:

initiating a latch mode;

deriving an output signal from a logic operation performed on an input signal while in the latch mode; and initiating the test mode blocking signal to disable the latch mode.

10. The method of claim 9, wherein the deriving an output signal comprises deriving a plurality of output signals, and wherein the test mode blocking signal is one of the plurality of output signals.

11. The method of claim 10, further comprising reestablishing the latch mode through a reset signal.

12. The method of claim 11, further comprising reestablishing the latch mode exclusively through the reset signal.

13. The method in claim 12, wherein reestablishing the latch mode through the reset signal comprises resetting the one of the plurality of output signals that initiated the test mode blocking signal.

\* \* \* \* \*

UNITED STATES PATENT AND TRADEMARK OFFICE
CERTIFICATE OF CORRECTION

PATENT NO.       : 7,376,874 B2                              Page 1 of 1
APPLICATION NO.  : 10/804371
DATED            : May 20, 2008
INVENTOR(S)      : Miller, Jr.

It is certified that error appears in the above-identified patent and that said Letters Patent is hereby corrected as shown below:

In column 5, line 27, in Claim 5, delete "node" and insert -- mode --, therefor.

In column 6, line 26, in Claim 13, delete "in" and insert -- of --, therefor.

Signed and Sealed this

Twenty-sixth Day of August, 2008

JON W. DUDAS
*Director of the United States Patent and Trademark Office*